United States Patent [19]

Werner

[11] Patent Number: 4,976,629
[45] Date of Patent: Dec. 11, 1990

[54] ZERO INSERTION FORCE DUAL IN-LINE LCD CONNECTOR

[75] Inventor: Oskar O. Werner, Leucadia, Calif.

[73] Assignee: Teledyne Kinetics, Solana Beach, Calif.

[21] Appl. No.: 417,169

[22] Filed: Oct. 4, 1989

[51] Int. Cl.⁵ ............................................. H01R 13/62
[52] U.S. Cl. .................................... 439/259; 439/71; 439/342
[58] Field of Search ..................... 439/55, 71, 72, 73, 439/525, 259, 260, 261, 262, 263, 264, 267, 342, 325, 326, 327, 328; 29/876

[56] References Cited

U.S. PATENT DOCUMENTS

| | | | |
|---|---|---|---|
| 3,500,285 | 3/1970 | Jones et al. | 439/259 X |
| 3,922,051 | 11/1975 | Reynolds | 439/327 X |
| 4,021,091 | 5/1977 | Anhalt et al. | 439/260 |
| 4,159,154 | 6/1979 | Arnold | 439/267 |
| 4,867,689 | 9/1989 | Redmond et al. | 439/71 |

Primary Examiner—Neil Abrams
Assistant Examiner—Khiem Nguyen
Attorney, Agent, or Firm—Nydegger & Harshman

[57] ABSTRACT

A zero insertion force dual in-line LCD connector has a connector body which holds the base ends of a plurality of resilient contacts in electrical engagement with a printed circuit board and holds the end points of these contacts in two substantially parallel rows. An actuator is mountable on the connector body to support a liquid crystal display (LCD) panel and is movable thereon between a first position wherein the LCD panel is distanced from the end points of the contacts and a second position wherein electrical pads on the LCD panel are moved into electrical engagement with the end points. The contacts are resilient to permit a wiping movement of the end points against the pads on the LCD panel when the LCD panel is moved into the second position.

17 Claims, 2 Drawing Sheets

ZERO INSERTION FORCE DUAL IN-LINE LCD CONNECTOR

FIELD OF THE INVENTION

The present invention pertains to electrical connectors. More specifically, the present invention pertains to connectors which establish electrical contact between electronic components and a printed circuit board. The present invention is particularly, but not exclusively, useful as a device which requires zero insertion force to establish an electrical connection between a dual in-line liquid crystal display and a printed circuit board.

BACKGROUND OF THE INVENTION

Liquid crystal display (LCD) panels are well known and widely used for visual presentations of many diverse forms of information. Somewhat unfortunately, however, LCD panels are typically made of very brittle substances, such as glass or ceramic, which can be easily broken, cracked, chipped or otherwise damaged. Consequently, during the manufacture or construction of a device which incorporates an LCD panel, care must be taken not to subject the LCD panel to forces which will cause such damage.

The potential for damage to an LCD panel is particularly acute when the LCD panel is electrically engaged with its operational electronic circuitry. To be effective, the connection between the LCD panel and its operational electronic circuitry needs to be reliable and robust. It happens, however, that in order to obtain effective connections, significant forces must be generated between the LCD panel and the electrical contacts which electronically engage the LCD to other circuitry. If improperly oriented, these forces can easily break or damage the LCD panel.

One solution sometimes used to minimize the damage that is likely to be caused during engagement of an electrical component, such as an LCD panel, with its cooperative electrical contacts involves using a connector which is operable with a so-called "zero insertion force". As generally used, the expression "zero insertion force" implies that the particular electrical component is prepositioned and stationary before any electrical contacts are urged into engagement with the component. Several devices have been proposed for this purpose. For example, U.S. Pat. No. 4,021,091 to Anholt et al., though not specifically concerned with LCD panel problems, discloses a zero force printed circuit board connector in which two rows of resilient contacts are mounted on opposite sides of a receiving slot. After the printed circuit board is positioned in the slot with zero force, the contacts are clamped onto the circuit board. In another example, U.S. Pat. No. 4,159,154 to Arnold discloses a zero insertion force connector which initially spreads opposed rows of contacts to create a slot into which a printed circuit board or similar electrical component can be inserted with zero force. Subsequently, the contacts of this device are released to clamp onto the board in the slot.

The present invention recognizes that the above-cited devices may be suitable for printed circuit boards or similar electrical components which have electrical contact points on directly opposite sides of the board or panel. These devices are not, however, necessarily suitable for LCD panels which have dual in-line (i.e. substantially parallel) rows of contact points that are located on the same side of the board. Further, the present invention recognizes that, although it is desirable to direct forces against an LCD panel which are effectively confined to a direction that is substantially perpendicular to the surface of the LCD in order to minimize damage to the LCD panel, this is not the only consideration. The present invention recognizes it is also desirable to have some "contact wipe", i.e. there should be some slight movement of the contact across the surface of the LCD panel during enagement of an electrical contact with an LCD panel, to ensure a proper electrical connection. The present invention further recognizes that many of the damage problems caused when forces are improperly applied to an LCD panel can be avoided if the LCD panel is prepositioned with zero force and then the panel itself is moved into engagement with appropriate electrical contacts.

In light of the above, the present invention provides a zero force connector for electrically engaging a dual in-line LCD panel with a printed circuit board which effectively orients impact forces on the LCD panel. The present invention also provides a zero force connector for electrically engaging a dual in-line LCD panel with a printed circuit board which establishes a robust connection between electrical components. Further, the present invention provides a zero insertion force connector for electrically engaging a dual in-line LCD panel with a printed circuit board which is simple to operate, relatively easy to manufacture, and comparatively cost-effective.

SUMMARYY OF THE INVENTION

A zero insertion force electrical connector for connecting a dual in-line liquid crystal display (LCD) panel to a printed circuit board in accordance with the present invention comprises a connector body and an actuator. Specifically, the connector body holds a plurality of electrical contacts on the printed circuit board with the exposed end points of these contacts aligned in a pair of substantially parallel rows. The actuator supports the LCD panel and is mountable on the connector body for reciprocal movement between a first position, wherein the LCD panel is separated from the contact end points, and a second position wherein the LCD panel is urged into electrical engagement with the contact end points.

Movement of the actuator between the above-described first and second positions is accomplished by a structural interaction between the actuator and the connector body which is capable of raising the LCD panel in a direction away from the printed circuit board and into engagement with the contact end points. For this purpose, the connector body is preferably formed with a series of aligned ramps which are substantially parallel to the rows of contact end points. Similarly, the actuator is formed with a series of aligned inclines which mate with the ramps on the connector body when the actuator is in its first or disengaged position. By sliding the acutator relative to the connector body, the inclines on the actuator "ride up" the ramps on the connector body to separate and distance the actuator from the connector body. Since the LCD panel is supported by the actuator, it too is moved. This movement causes engagement of the LCD panel with the contact end points and, due to the resilience of the contacts, this movement also causes some slight movement of the contact end points over the electrical pads on the LCD panel to provide a "contact wipe".

The novel features of this invention, as well as the invention itself, both as to its structure and its operation, will be best understood from the accompanying description, in which similar reference characters refer to similar parts, and in which:

DESCRIPTION OF THE PREFERRED EMBODIMENT

Figure 1:
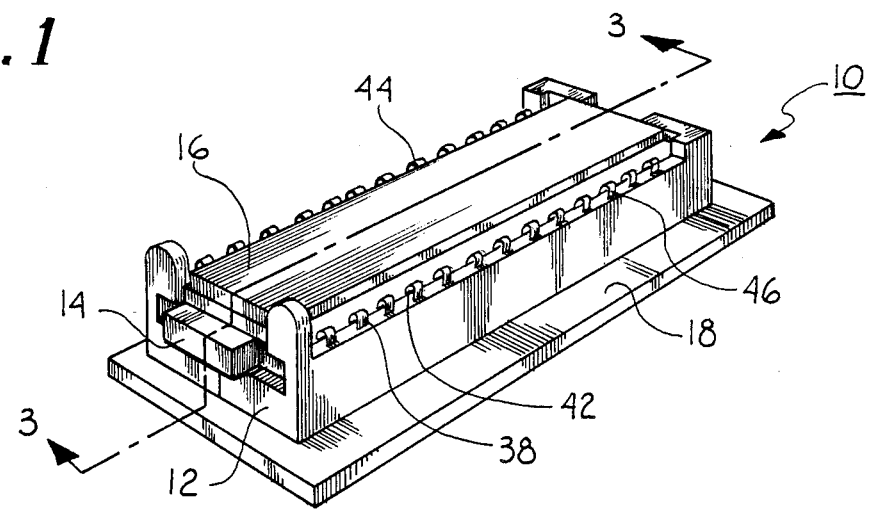
FIG. 1 is a perspective view of the dual in-line electrical connector of the present invention holding a liquid crystal display panel in electrical engagement with a printed circuit board.

Referring initially to FIG. 1, an electrical connector for connecting a dual in-line liquid crystal display (LCD) panel with a printed circuit (pc) board in accordance with the present invention, is shown and generally designated 10. For the present invention, connection 10 essentially comprises a connector body 12 and an actuator 14. As shown, connector 10 uses the cooperation of structure between connector body 12 and actuator 14 to electrically engage the LCD panel 16 with pc board 18.

Figure 2:
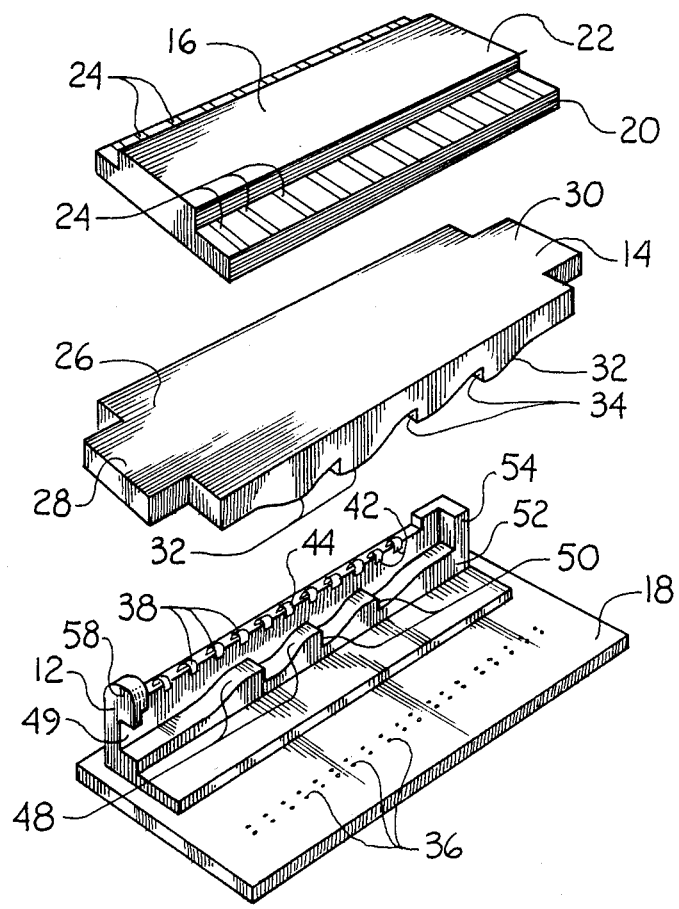
FIG. 2 is an exploded perspective view of parts of the dual in-line electrical connector.

The components of connector 10 can perhaps be best understood by reference to the exploded view of FIG. 2 wherein it is seen that LCD panel 16 includes a substrate 20 and a superstrate 22 which overlies the substrate 20 to enclose liquid crystal elements (not shown) that are well known in the art. LCD panel 16 also includes electrical pads 24 that are electrically connected to liquid crystal elements between substrate 20 and superstrate 22 and which extend outwardly on substrate 20 from the interface between substrate 20 and superstrate 22 substantially as shown. The pads 24 shown in FIG. 2 are only exemplary as these pads 24 are normally difficult to be seen by the untrained eye. Typically, superstrate 22 is made of glass or some other similarly transparent material and the substrate 20 is made of glass or ceramic. In any event, LCD panel 16 is normally made of very brittle and relatively easily damaged materials.

FIG. 2 also shows that actuator 14 is a generally elongated structure which has a substantially flat surface 26 for supporting LCD panel 16. Additionally, actuator 14 is formed with end tabs 28 and 30 which provide means for manipulating the movement of actuator 14 on connector 10 in a manner to be subsequently disclosed. Importantly, actuator 14 is formed with a series of aligned inclines 32 which are located on the side of actuator 14 opposite flat surface 26. Separating the inclines 32 are a series of respective wall portions 34.

Figure 4:
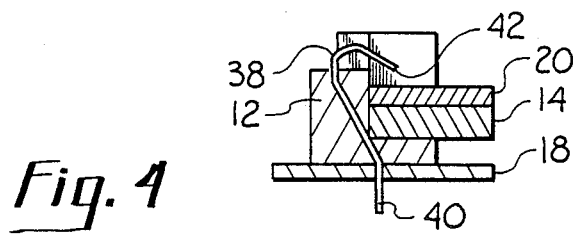
FIG. 4 is a cross-sectional view of the dual in-line electrical connector as seen along the line 4—4 in FIG. 3.

The pc board 18 in FIG. 2 is shown formed with holes 36 which extend through the pc board 18 to provide access to circuitry (not shown) on the underneath side of pc board 18. As intended by the present invention, a plurality of electrical contacts 38 are held by connector body 12 on pc board 18 for electrical engagement with the circuitry (not shown). This structural cooperation is perhaps best appreciated by a brief reference to FIGS. 4 and 6 wherein it is shown that each electrical contact 38 is formed with a base portion 40 that is inserted through a respective hole 36 in pc board 18. As shown in these figures, the electrical contacts 38 also have end points 42 which are held extended from the connector body 12 and exposed for electrical contact with the pads 24 of LCD panel 16. As best seen in FIG. 1, the end points 42 of electrical contacts 38 are held by connector body 12 in a pair of substantially parallel rows 44 and 46. It is to be appreciated by the skilled artisan that the different configurations for electrical contacts 38 shown respectively in FIG. 4 and FIG. 6 do not affect their function but are incorporated merely for the purpose of facilitating the insertion of base portions 40 into holes 36. Typically, these configurations are alternated along the rows 44 and 46.

Returning now to FIG. 2, it will be seen that connector body 12 is formed with a series of ramps 48 which are aligned substantially parallel to row 44 of contact end points 42. Separating the ramps are a series of respective wall portions 50.

It is to be noted that FIG. 2 shows only half of a connector body 12. As seen in FIG. 1, connector body 12 actually includes two oppositely facing mirror image portions which are similar to the portion 52 shown in FIG. 2. Importantly, connector body 12 can thus be bifurcated into two portions 52 in order to position the rows 44 and 46 of contact end points 42 at any appropriate distance from each other on pc board 18 to accommodate the dimensions of LCD panel 16.

Figure 3:
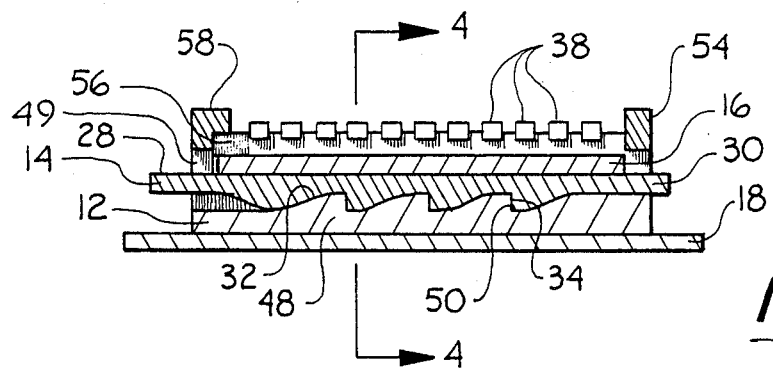
FIG. 3 is a cross-sectional view of the dual in-line electrical connector as seen along the line 3—3 in FIG. 1, with the actuator in the disengaged position.

In the operation of electrical connector 10, actuator 14 is positioned on connector body 12 with its inclines 32 matingly engaged with the ramps 48 of connector body 12 as shown in FIG. 3. LCD panel 16 is then positioned against flat surface 26 of actuator 14 as also shown in FIG. 3. More specifically, actuator 14 is first inserted through the opening 49 on connector 10 and positioned as shown in FIG. 3. LCD panel 16 is then inserted through opening 49 and, as stated above, is positioned on the relatively flat surface 26 of actuator 14. Importantly, the positioned of LCD panel 16 on actuator 14 is done with "zero force". As can be appreciated by cross referencing FIS. 2, 3 and 4, this positions the pads 24 on substrate 20 of LCD panel 16 directly in line with respective end points 42 of electrical contacts 38. For the configuration shown in FIGS. 3 and 4, connector 10 and LCD panel 16 are in their disengaged positions.

By pushing on end 28 of actuator 14, actuator 14 is moved to slide across the series of ramps 48 that are formed on connector body 12. This movement causes the inclines 32 on actuator 14 to ride up onto the ramps 48 of connector body 12 and distance actuator 14 from the pc board 18. On the other hand, this movement also causes LCD panel 16 to come into electrical engagement with the electrical contacts 38. Specifically, this pushing on end tab 28 causes connector 10 to change from its disengaged position (shown in FIG. 3) to an engaged position (shown in FIG. 5).

Figure 5:
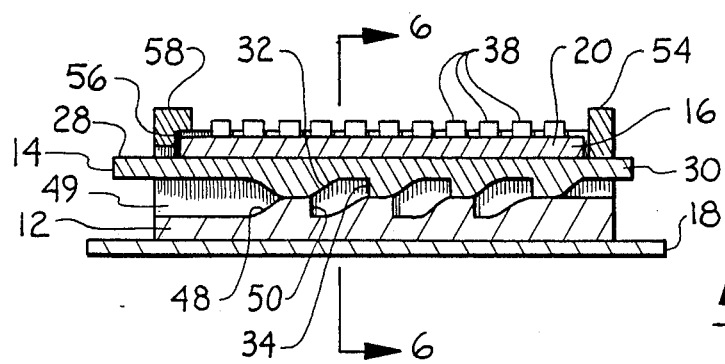
FIG. 5 is a cross-sectional view of the dual in-line electrical connector as shown in FIG. 3 with the actuator in the engaged position.
Figure 6:
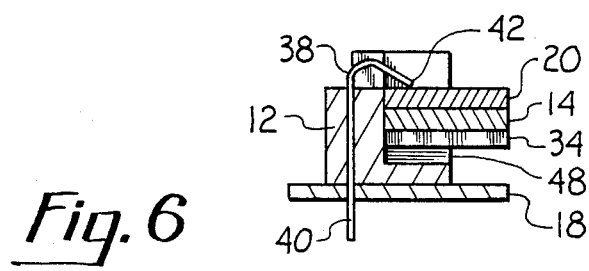
FIG. 6 is a cross-sectional view of the dual in-line electrical connector as seen along the line 6—6 in FIG. 5.

As will be appreciated with reference to FIGS. 5 and 6, when connector 10 is in its engaged position, the end points 42 of electrical contacts 38 are urged into direct electrical contact with pads 24 of LCD panel 16. Further, this engagement causes end points 42 to move slightly across the pads 24 to provide some "contact wipe". Further, when LCD panel 16 is in the engaged position, one end of substrate 20 is positioned against the abutment 54 of connector body 12 while the other end of substrate 20 is disposed in the groove 56 of abutment 58 of connector body 12. As so positioned, LCD panel 16 can be effectively held between actuator 14 and the rows 44 and 46 for operational purposes. The removal of LCD panel 16 from connector 10 can be easily accomplished by pushing end tab 30. This moves actuator 14 from its position shown in FIG. 5 to that shown in FIG. 3. This also disengages LCD panel 16 from electrical engagement with rows 44 and 46 and permits removal of LCD panel 16 from flat surface 26 of actuator 14.

In addition to its function as an electrical connector, the connector 10 can also be used as a test platform for LCD panels 16. Further, connector 10 can be used to connect electrical components other than LCD panel 16 with pc board 18. For example, connector 10 can be used to connect pc board 18 with another pc board.

While the particular zero insertion force dual in-line LCD connector as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

What is claimed is:

1. A device for electrically engaging a dual in-line liquid crystal display panel with a printed circuit board which comprises:
    a plurality of electrical contacts, each of said contacts having a base and an end point;
    a connector body for holding said contacts on said circuit board with said bases in electrical engagement therewith and with said end points distanced from said circuit board in a pair of substantially parallel aligned rows, said connector body being formed with a series of aligned ramps;
    an actuator formed with a series of aligned inclines for holding said display panel in a first position between said circuit board and said rows of aligned end points wherein said display panel is distanced from said end points, said actuator being reciprocally moveable on said connector body with said ramps interacting with said inclines for moving said display panel between said first position and a second position wherein said display panel is urged into electrical engagement with said end points of said contacts.

2. A device for electrically engaging a dual in-line liquid crystal display panel with a printed circuit board as recited in claim 1 wherein said display panel is in said first position when said inclines are mated with said ramps.

3. A device for electrically engaging a dual in-line liquid crystal display panel with a printed circuit board as recited in claim 1 wherein said series of ramps on said connector body are aligned substantially parallel to said rows of said end points.

4. A device for electrically engaging a dual in-line liquid crystal display panel with a printed circuit board as recited in claim 1 wherein said connector body further comprises first end flanges and second end flanges respectively positioned at opposite ends of said rows of end points to prevent a sliding movement of said display panel in a direction substantially parallel to said rows of end points when said connector is configured in its engaged position.

5. A device for electrically engaging a dual in-line liquid crystal display panel with a printed circuit board as recited in claim 1 wherein said actuator is made of a rigid plastic.

6. A device for electrically engaging a dual in-line liquid crystal display panel with a printed circuit board as recited in claim 1 wherein said display panel is substantially made of glass and includes pads for establishing electrical engagement with said end points.

7. A device for electrically engaging a dual in-line liquid crystal display panel with a printed circuit board as recited in claim 6 wherein said contacts are resilient to provide a wiping motion between said end points on said contacts and said pads on said display panel during movement of said display panel into said second position.

8. A device for electrically engaging a liquid crystal display panel with a printed circuit board which comprises:
    a plurality of resilient contacts, each of said contacts having a base and an end point;
    a connector body for holding said bases of said contacts in electrical engagement with said circuit board, said body formed with a series of ramps; and
    an actuator formed with a series of inclines and having a substantially flat surface for supporting said display panel, said actuator mountable on said connector body and reciprocally movable thereon between a first position wherein said inclines mate with said ramps to distance said display panel from said end points of said contacts, and a second position wherein said inclines and said ramps interact to move said display panel into electrical engagement with said end points of said contacts.

9. A device for electrically engaging a liquid crystal display panel with a printed circuit board as recited in claim 8 wherein said connector body holds said contacts with said end points aligned in a row.

10. A device for electrically engaging a liquid crystal display panel with a printed circuit board as recited in claim 9 further comprising a second connector body for holding a plurality of said contacts with said bases of said contacts in electrical engagement with said circuit board and with said end points of said contacts aligned in a row, said second connector body formed with a series of ramps and said second connector body positioned relative to said connector body to establish a substantially parallel relationship between said respective rows of end points.

11. A device for electrically engaging a liquid crystal display panel with a printed circuit board as recited in claim 10 wherein said actuator is mountable on said connector body and said second connector body for movement thereon between said first and second positions.

12. A device for electrically engaging a liquid crystal display panel with a printed circuit board as recited in claim 11 wherein said connector body and said second connector body further comprise first end flanges and second end flanges respectively positioned at opposite ends of said rows of end points to prevent a sliding movement of said display panel in a direction substantially parallel to said rows of end points with a printed circuit board.

13. A device for electrically engaging a liquid crystal display panel with a printed circuit board as recited in claim 11 wherein said actuator is made of a rigid plastic.

14. A device for electrically engaging a liquid crystal display panel with a printed circuit board as recited in claim 11 wherein said display panel is substantially made of glass and includes pads for establishing electrical engagement with said end points.

15. A device for electrically engaging a liquid crystal display panel with a printed circuit board as recited in claim 14 wherein said contacts are resilient to provide a wiping motion between said end points on said contacts and said pads on said display panel during movement of said display panel into said second position.

16. A method for electrically engaging a liquid crystal display panel with a printed circuit board which comprises the steps of:
  holding a plurality of electrical contacts on a connector board having a series of inclined ramps with the bases of said contacts in electrical engagement with said circuit board and the end points of said contacts distanced from said circuit board in a pair of substantially parallel aligned rows;
  positioning said display panel onto an actuator formed with a series of inclines and having a flat surface for supporting said display panel;
  inserting said actuator into a first position between the circuit board and said rows of aligned end points wherein said inclines mate with said ramps to distance said panel from said end points of said contacts; and
  longitudinally moving said actuator from said first position to a second position wherein said inclines and said ramps interact to urge said electrical pads on said display panel into electrical engagement with said end points of said contacts.

17. A method for electrically engaging a liquid crystal display panel with a printed circuit board as recited in claim 16 wherein said moving step is accomplished while wiping said end points on said pads.

* * * * *